(12) United States Patent
Ye (10) Patent No.: US 10,452,172 B2
(45) Date of Patent: Oct. 22, 2019

(54) TOUCH DISPLAY PANEL AND METHOD FOR MANUFACTURING THE SAME

(71) Applicant: Wuhan China Star Optoelectronics Technology Co., Ltd., Wuhan, Hubei (CN)

(72) Inventor: Jian Ye, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 49 days.

(21) Appl. No.: 15/526,326

(22) PCT Filed: Mar. 13, 2017

(86) PCT No.: PCT/CN2017/076472
§ 371 (c)(1),
(2) Date: May 11, 2017

(87) PCT Pub. No.: WO2018/152880
PCT Pub. Date: Aug. 30, 2018

(65) Prior Publication Data
US 2018/0292926 A1    Oct. 11, 2018

(51) Int. Cl.
*G06F 3/041* (2006.01)
*H01L 27/32* (2006.01)
(Continued)

(52) U.S. Cl.
CPC ............ *G06F 3/041* (2013.01); *G06F 3/044* (2013.01); *G06F 3/0412* (2013.01);
(Continued)

(58) Field of Classification Search
None
See application file for complete search history.

(56) References Cited

U.S. PATENT DOCUMENTS

| 2009/0322702 | A1  | 12/2009 | Chien et al. |
| 2015/0015517 | A1* | 1/2015  | Zhao ............... G06F 3/041 345/173 |
| 2017/0031490 | A1* | 2/2017  | Hashida ............ G06F 3/041 |

FOREIGN PATENT DOCUMENTS

| CN | 101251667 A | 8/2008 |
| CN | 103941952 A | 7/2014 |

(Continued)

*Primary Examiner* — Kenneth B Lee, Jr.
(74) *Attorney, Agent, or Firm* — Andrew C. Cheng (57) ABSTRACT

A touch display panel includes a lower substrate, an upper substrate opposite to the lower substrate, the upper substrate having a black matrix and a photoresist layer thereon, the black matrix comprising a plurality of transverse light-shielding strips extending along a first direction and a plurality of longitudinal light-shielding strips extending along a second direction, the first direction and the second direction being perpendicular to each other, the plurality of the transverse light-shielding strips and a plurality of the longitudinal light-shielding strips interwoven to form a plurality of opening regions, the photoresist layers located in the opening regions. Wherein one of the transverse light-shielding strip and the longitudinal light-shielding strip includes a first black substrate layer and a first touch electrode layer, and the first black substrate layer being stacked with the first touch electrode layer. A method of manufacturing the touch display panel is also provided here.

10 Claims, 5 Drawing Sheets

(51) Int. Cl.
*H01L 51/52* (2006.01)
*G06F 3/044* (2006.01)

(52) U.S. Cl.
CPC .......... *H01L 27/322* (2013.01); *H01L 27/323* (2013.01); *H01L 51/5284* (2013.01); *G06F 2203/04103* (2013.01); *G06F 2203/04111* (2013.01); *H01L 27/3244* (2013.01); *H01L 2227/323* (2013.01); *H01L 2251/558* (2013.01)

(56) References Cited

FOREIGN PATENT DOCUMENTS

| | | |
|---|---|---|
| CN | 104635372 A | 5/2015 |
| CN | 104679374 A | 6/2015 |
| CN | 105824470 A | 8/2016 |

* cited by examiner

TOUCH DISPLAY PANEL AND METHOD FOR MANUFACTURING THE SAME

CROSS REFERENCE TO RELATED APPLICATION

This application claims the priority of Chinese Patent Application No. 201710096554.X, entitled "TOUCH DISPLAY PANEL AND METHOD FOR MANUFACTURING THE SAME", filed on Feb. 22, 2017, the disclosure of which is incorporated herein by reference in its entirety.

FIELD OF THE INVENTION

The invention relates to the field of display technology, and particularly to a touch display panel and method for manufacturing the touch display panel.

BACKGROUND OF THE INVENTION

In recent years, with the development of electronic technology, the touch display device such as smart phones, tablet PCs that is put into use in people's daily life more and more widely. Moreover, the touch display devices are more and more functional, which provides more convenience for users.

The touch display devices includes a touch panel. The touch panel includes a display unit and a touch unit on the display unit. For instance, the display unit is an OLED panel or a LCD panel. Wherein, the LCD panel includes a backlight, a thin film transistor array substrate, a liquid crystal layer and a color filter. The principle of the display unit is whether the white light from the backlight go through depends on the turning of the thin film transistor liquid crystal, and with the help of the color filter, the white light which across through the liquid crystal could display the corresponding RGB and other different colors. One of the OLED panel is a white-Light OLED panel. The white-Light OLED panel has only one kind of white light emitting material. The white-Light OLED panel uses white LEDs as the backlight. The white light passes through the color filter and generates color images. Whether the pixel unit emitting white light or no light is controlled by the thin film transistor. The pixel unit displaying the corresponding RGB and other different colors depends on the color filter. Compared with a self-luminous organic light-emitting display with RGB three color, the white light organic light-emitting display still retains the color filter. The touch unit includes a first touch electrode, a second touch electrode, and an insulating layer between the first touch electrode and the second touch electrode. As the touch unit is located on the display unit, the whole OLED could be overall thickness, and it is not good for lighting and thinning the touch display panel.

SUMMARY OF THE INVENTION

A technical problem to be solved in the embodiment of the present invention is to provide a touch display panel and a method of manufacturing the same. It can be used to make the touch display panel light and thin.

In order to solve the above technical problems, a first aspect of the present invention provides a touch display panel includes a lower substrate, an upper substrate, the upper substrate and the lower substrate disposed opposite to each other, the upper substrate having a black matrix and a photoresist layer thereon, the black matrix includes a plurality of transverse light-shielding strips extending along a first direction and a plurality of longitudinal light-shielding strips extending along a second direction, the first direction and the second direction being perpendicular to each other, the plurality of the transverse light-shielding strips and a plurality of the longitudinal light-shielding strips interwoven to form a plurality of opening regions, the photoresist layers located in the opening regions. Wherein one of the transverse light-shielding strip and the longitudinal light-shielding strip includes a first black substrate layer and a first touch electrode layer, and the first black substrate layer being stacked with the first touch electrode layer.

Another of the transverse light-shielding strip or the longitudinal light-shielding strip includes a second black substrate layer and a second touch electrode layer, the second black substrate layer is stacked with the second touch electrode layer, and the second touch electrode layer and the first touch electrode are electrically insulated with each other.

A conductive bridge locates on the upper substrate, the conductive bridge is used for electrically connecting the second touch electrode layer on both sides of the first touch electrode layer, and the conductive bridge is electrically insulated from the first touch electrode layer.

The second touch electrode layer locate on the bottom of the black matrix, an extending direction of the second touch electrode layer is perpendicular to that of the first touch electrode layer, and an insulating layer is configured between the second touch electrode layer and the first touch electrode layer.

The upper substrate is provided with a second touch electrode layer on the surface which back to the black matrix, and the extending direction of the second touch electrode layer is perpendicular to the extending direction of the first touch electrode layer.

The first black substrate layer is located on a bottom surface of the upper substrate, the first touch electrode layer is stacked on the surface of the first black matrix layer, or the first touch electrode layer is located on a bottom surface of the upper substrate, the first black matrix layer is stacked on the surface of the first touch electrode layer.

The thickness of the first touch electrode layer is 10 nm~1000 nm, and the thickness of the first black matrix layer is 0.5 um~50 um.

The first touch electrode layer is a mixed layer with black photosensitive resin and nano conducted wire.

The nano conductive wire is from one or more of gold, silver, copper, aluminum, carbon or alloy, the diameter of the nano conducted wire is 10 nm~1000 nm, the length is 0.1 um~50 um.

In order to solve the above technical problems, another aspect of the present invention provides a touch display panel includes: providing a lower substrate and an upper substrate. Applying a black light-shielding layer to the upper substrate, and a touch electrode layer onto the upper substrate. Exposing and developing the black light-shielding layer and the touch electrode layer to form a black matrix, the black matrix includes a plurality of transverse light-shielding strips extending along a first direction and a plurality of longitudinal light-shielding strips extending along a second direction, the first direction and the second direction are perpendicular, the plurality of the transverse light-shielding strips and a plurality of the longitudinal light-shielding strips interweaving a plurality of open areas, one of the transverse light-shielding strips and the longitudinal light-shielding strips includes a first black substrate layer and a first touch electrode layer, and the first black substrate layer is stacked with the first touch electrode layer. The photoresist layers locate in the open areas.

The embodiment of the present invention has the advantageous effects as follows.

The transverse light-shielding strips or the longitudinal light-shielding strips includes a first black substrate layer and a first touch electrode layer. And the first black substrate layer is stacked with the first touch electrode layer. So the first black substrate layer or the first touch electrode layer is included in the black matrix. It is not necessary to provide two additional touch electrodes as in the prior art, then the thickness of the touch screen can be reduced, and the touch can be lightened. And the process and the costs also can be reduced. Since the first black substrate layer and the first touch electrode layer are stacked to form one of the light blocking strips, the whole light shielding strips is formed by the touch electrode. The costs is greatly reduced.

BRIEF DESCRIPTION OF THE DRAWINGS

In order to more clearly illustrate technical solutions of embodiments of the invention or the prior art, drawings will be used in the description of embodiments or the prior art will be given a brief description below. Apparently, the drawings in the following description only are some of embodiments of the invention, the ordinary skill in the art can obtain other drawings according to these illustrated drawings without creative effort.

DETAILED DESCRIPTION OF THE PREFERRED EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

Terms "comprise", "include", "have" and other forms thereof in embodiments, claims and figures of the disclosure indicate exclusive inclusion. Such as processes, methods, systems, products or devices containing a series of steps or elements are not restricted to the listed steps or elements, steps or elements out of list are optionally included. Or other steps or elements inherent in the process, methods, products or devices are optionally included. Moreover, terms "first", "second", "third" are used to distinguish different objects, rather than describing a certain order.

The First Embodiment

The touch display panel includes display unit and touch unit, the display can be a liquid crystal display, an organic light emitting diode or other display unit. For convenience of description, the display unit use an OLED as an example in the following descriptions, and the touch unit is used to realize a touch function.

Refer to FIG. 1 to FIG. 5, the touch display panel includes a lower substrate 110 and an upper substrate 150. The upper substrate 150 and the lower substrate 110 are disposed opposite to each other. The upper substrate 150 locates on the lower substrate 110. The upper substrate 150 or the lower substrate 110 can be made of a rigid substrate, such as glass substrate. Or the upper substrate 150 or the lower substrate 110 can be made of a flexible substrate, such as polyimide plastic substrate. The lower substrate 110 is configured with a thin film transistor and an organic light emitting unit 120. An output end of the thin film transistor is electrically connected with the organic light emitting unit 120. The upper substrate 150 is provided with a black matrix 200 and a photoresist layer 140. The black matrix 200 includes a plurality of transverse light-shielding strips 210 extending along a first direction and a plurality of longitudinal light-shielding strips 220 extending along a second direction. The first direction and the second direction are perpendicular to each other. In this embodiment, the plurality of the transverse light-shielding strips 210 extending along the X axis, and the plurality of the longitudinal light-shielding strips 220 extending along the Y axis. The plurality of the transverse light-shielding strips 210 and the plurality of the longitudinal light-shielding strips 220 are interwoven to form a plurality of opening regions. The opening regions are permeable to light. The photoresist layers 140 locate in the opening regions. For example, the photoresist layers 140 is red photoresist layers (R), green photoresist layer (G), or blue photoresist layer (B). The arrangement order of the red photoresist layer (R), the green photoresist layer (G) and the blue photoresist layer (B) is a well-known general knowledge of those skilled in the art and will not be described here. In addition, the photoresist layers 140 can also be red photoresist layers (R), green photoresist layer (G), blue photoresist layer (B) or white photoresist layer (W). The arrangement order of the red photoresist layer (R), the green photoresist layer (G) the blue photoresist layer (B) and the white photoresist layer (W) is a well-known general knowledge of those skilled in the art and will not be described here.

Figure 4:
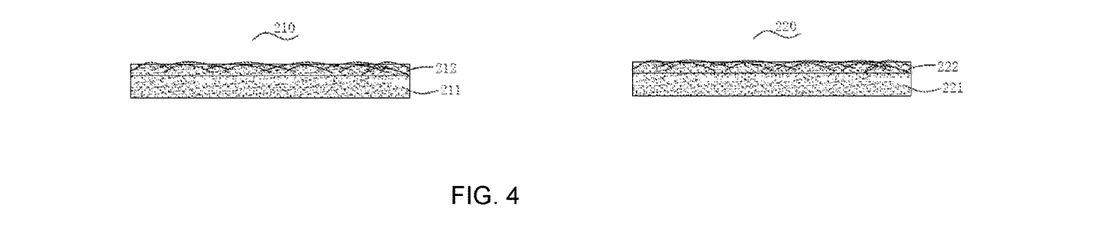
FIG. 4 is a section view of the transverse light-shielding strips and the longitudinal light-shielding strips according to the first embodiment of the invention.
Figure 5:
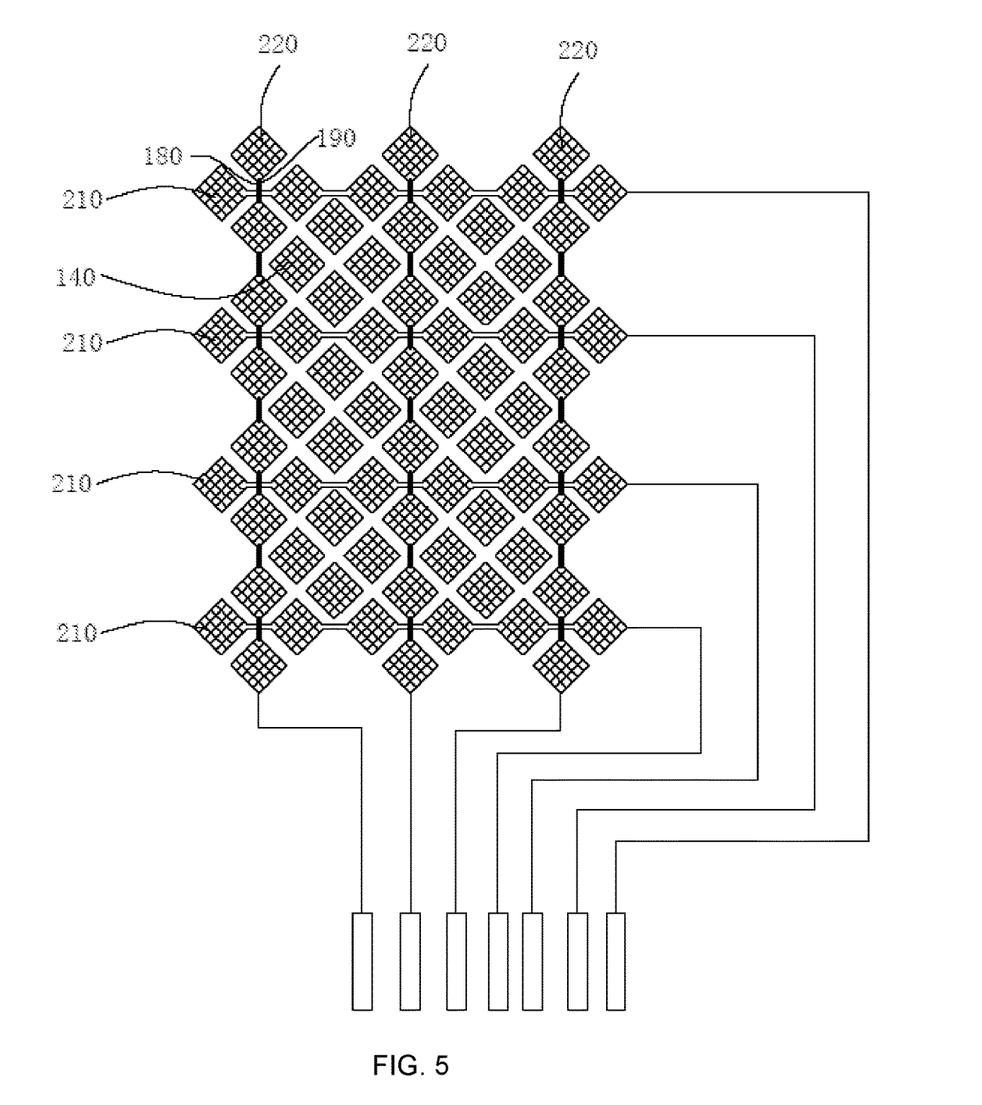
FIG. 5 is a top view of the first touch electrode layer and the second touch electrode layer according to the first embodiment of the invention.

Refer to FIG. 4 and FIG. 5, the transverse light-shielding strips 210 or the longitudinal light-shielding strips 220 can include a first black substrate layer 211 and a first touch electrode layer 212. The first touch electrode layer 212 is located in the black matrix 200. In this embodiment, the transverse light-shielding strips 210 includes the first black substrate layer 211 and the first touch electrode layer 212. And the first black substrate layer 211 can be stacked with the first touch electrode layer 212. That is, the first black matrix layer 211 can be stacked on the first touch electrode layer 212, or the first touch electrode layer 212 can be stacked on the first black substrate layer 211. In this embodiment, the first black matrix layer 211 is used for shading, and the first touch electrode layer 212 is used as one of the electrodes of the touch unit.

Since the transverse light-shielding strip 210 or the longitudinal light-shielding strip 220 includes the first black matrix layer 211 and the first touch electrode layer 212, the first black matrix layer 211 can be stacked with the first touch electrode layer 212, and one of the touch electrodes can be contained in the black matrix 200. As such, it is not necessary to provide two touch electrodes additionally as the prior art, the thickness of the touch display panel can be reduced, the touch display panel can be lightened, a process for making the touch display panel can be simplified, and the costs can be reduced. What is more, the first black matrix layer 211 and the first touch electrode layer 212 are stacked so as to form one of the light shielding strips, the cost of the light shielding strip is greatly reduced compared with the light shielding strip made of the whole touch electrode in the prior art.

Figure 3:
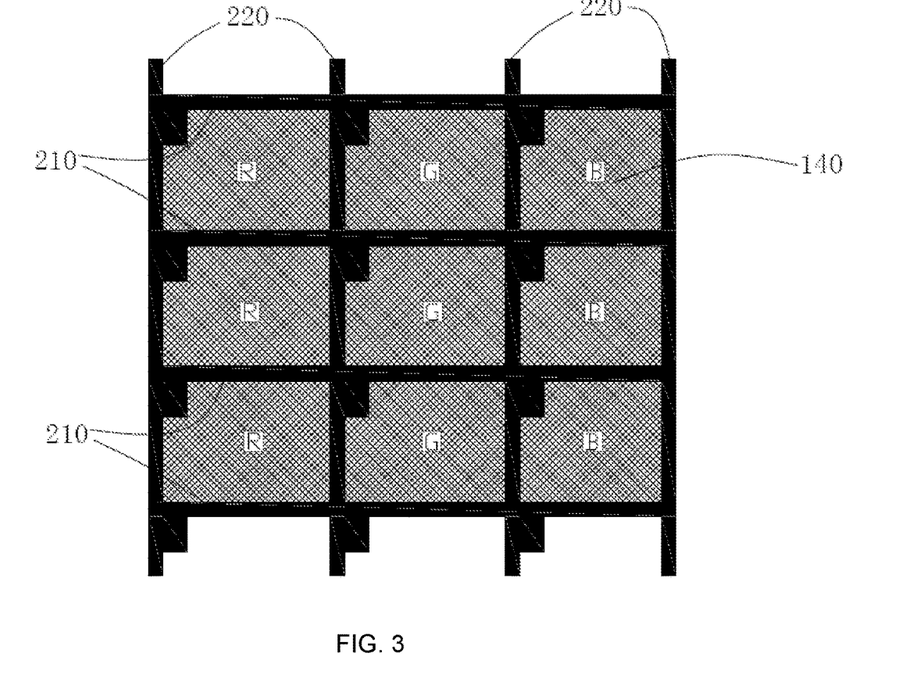
FIG. 3 is a top view of the black matrix, the photoresist layer according to the first embodiment of the invention.

Refer to FIG. 3 to FIG. 5, another of the transverse light-shielding strip 210 and the longitudinal light-shielding strip 220 includes a second black matrix layer 221 and a second touch electrode layer 222. In other words, the second touch electrode layer 222 can be included in the black matrix 200. In the present embodiment, the longitudinal light-shielding strip 220 includes the second black matrix layer 221 and the second touch electrode layer 222. The second black substrate layer 221 can be stacked with the second touch electrode layer 222. That is, the second black matrix layer 221 can be stacked on the second touch electrode layer 222, or the second touch electrode layer 222 can be stacked on the second black substrate layer 221. In this embodiment, the second black matrix layer 221 is used for shading, and the second touch electrode layer 222 is used as one of the electrodes of the touch unit. The extending direction of the second touch electrode layer 222 is perpendicular to the extending direction of the first touch electrode layer 212. In the present embodiment, when the first touch electrode layer 212 can be contained in the transverse light-shielding strip 210, the first touch electrode layer 212 extends along the X-axis direction, and when the second touch electrode layer 222 can be contained in the longitudinal light-shielding strip 220, the second touch electrode layer 222 extends along the Y-axis direction. Thus, both the first touch electrode and the second touch electrode are contained in the black matrix 200 so that it is not necessary to provide the touch electrode additionally. The touch unit can be embedded in the display unit, so the thickness of the touch display panel can be reduced and the touch display panel can be lightened. Further, it is good for the process of simplification and cost reduction.

In the present embodiment, the extending direction of the second touch electrode layer 222 is perpendicular to the extending direction of the first touch electrode layer 212. The transverse light-shielding strip 210 and the longitudinal light-shielding strip 220 are both double-layered structures. In order to prevent the first touch electrode layer 212 is electrically connected to the second touch electrode layer 222, as well as to make the second touch electrode layer 222 is electrically insulated from the first touch electrode layer 212, in the present embodiment, the second touch electrode layer 222 on both sides of the first touch electrode layer 212 is cut off. The upper substrate 150 is provided with a conductive bridge 180, which is made of a conductive material such as gold, silver, copper, iron, graphite or the like or an alloy. The conductive bridge 180 is electrically connected to the second touch electrode layer 222 on both sides of the first touch electrode layer 212. And the conductive bridge 180 is electrically insulated from the first touch electrode layer 212. For example, an insulating layer is provided between the conductive bridge 180 and the first touch electrode layer 212. And the insulating layer is an intermediate insulating layer 190. In the present embodiment, the first black matrix layer 211 and the second black matrix layer 221 are close to the lower surface of the upper substrate 150. And the first touch electrode layer 212 is stacked on the first black matrix layer 211, the second touch electrode layer 222 can be stacked on the second black matrix layer 221. In other embodiments of the present invention, the first touch electrode layer and the first black matrix layer could be stacked conversely, and the second touch electrode layer and the second black matrix layer may be stacked conversely. In addition, in other embodiments of the present invention, in order to prevent the first touch electrode layer and the second touch electrode layer from being electrically connected, the first touch electrode layer can be disposed on the back surface of the upper substrate. The black matrix layer can be stacked on the first touch electrode layer, the second black matrix layer can be disposed on the back surface of the upper substrate. Since the thickness of the black matrix layer is relatively thick so that the first touch electrode layer and the second touch electrode layer are not electrically connected when the second touch electrode layer is stacked on the second black matrix layer. The first touch electrode layer and the second touch electrode layer can be electrically insulated by the black matrix layer. In addition, in other embodiments of the present invention, the transverse light-shielding strip and the longitudinal light-shielding strip may also be of three or more layers, and the first touch electrode and the second touch electrode layers may be electrically insulated.

In the present embodiment, the first black substrate layer 211 is located on the lower surface of the upper substrate 150, and the first touch electrode layer 212 can be stacked on the surface of the first black substrate layer 211. Likewise the second black substrate layer 221 can be on the lower surface of the upper substrate 150, and the second touch electrode layer 222 can be stacked on the surface of the second black substrate layer 221. The first black substrate layer 211 and the second black substrate layer 221 can be located on the same layer, the first touch electrode layer 212 and the second touch electrode layer 222 are located on the same layer, and a manufacturing process can be a simple. In other embodiments of the present invention, the first touch electrode layer can be on a lower surface of the upper substrate, the first black substrate layer can be stacked on the surface of the first touch electrode layer. And likewise, the second touch electrode layer can be located on the lower surface of the upper substrate, and the second black substrate layer can be stacked on the surface of the second touch electrode layer.

In the present embodiment, the thickness of the transverse light-shielding strip 210 or the longitudinal light-shielding strip 220 can be from 0.5 μm to 50 μm, for example, 0.5 μm, 1 μm, 5 μm, 10 μm, 15 μm, 20 μm, 25 μm, 30 μm, 40 μm, 45 μm, 50 μm, and etc. The thickness of the first touch electrode layer 212 is much less than the thickness of the first black matrix layer 211. In the present embodiment, the thickness of the first touch electrode layer 212 can be from 10 nm to 1000 nm, for example, 10 nm, 50 nm, 100 nm, 200 nm, 300 nm, 400 nm, 500 nm, 600 nm, 700 nm, 800 nm, 900 nm, 1000 nm, etc. And the thickness of the first black substrate layer 211 can be 0.5 μm to 50 μm, such as 0.5 μm, 1 μm, 5 μm, 10 μm, 20 μm, 30 μm, 40 μm, 50 μm, etc. The thickness of the second touch electrode layer 222 is much less than the thickness of the second black substrate layer 221. The thickness of second touch electrode layer 222 can be from 10 nm to 1000 nm, such as 10 nm, 50 nm, 100 nm, 200 nm, 300 nm, 400 nm, 500 nm, 600 nm, 700 nm, 800 nm, 900 nm, 1000 nm, etc. And the thickness of the second black substrate layer 221 can be from 0.5 μm to 50 μm, such as 0.5 μm, 1 μm, 5 μm, 10 μm, 20 μm, 30 μm, 40 μm, 50 μm, etc.

In the present embodiment, the first black substrate layer 211 and the second black substrate layer 221 are UV-curable black photosensitive resin for shading. And both of the first touch electrode layer 212 and the second touch electrode layer 222 are a mixed layer of a nano conductive wire and a black photosensitive resin. Wherein the nano conductive wire is one or more of gold, silver, copper, aluminum, carbon or alloy. For example, the conductive wire is a nano silver wire. The diameter of the nano conductive wire can be from 10 nm to 1000 nm, such as 10 nm, 50 nm, 100 nm, 200 nm, 300 nm, 400 nm, 500 nm, 600 nm, 700 nm, 800 nm, 900 nm, 1000 nm, etc, and the length of the nano conductive wire can be from 0.1 μm to 50 μm, such as 0.1 μm, 0.5 μm, 1 μm, 5 μm, 10 μm, 15 μm, 20 μm, 25 μm, 30 μm, 40 μm, 45 μm, 50 μm, etc. The square resistance of the mixed layer is from 0.1 ohm/square to 500 ohm/square, such as 0.1 ohm/square, 0.5 ohm/square, 1 ohm/square, 10 ohm/square, 50 ohm/square, 100 ohm/square, 200 ohm/square, 300 ohm/square, 400 ohm/square, 500 ohm/square, etc.

Figure 1:
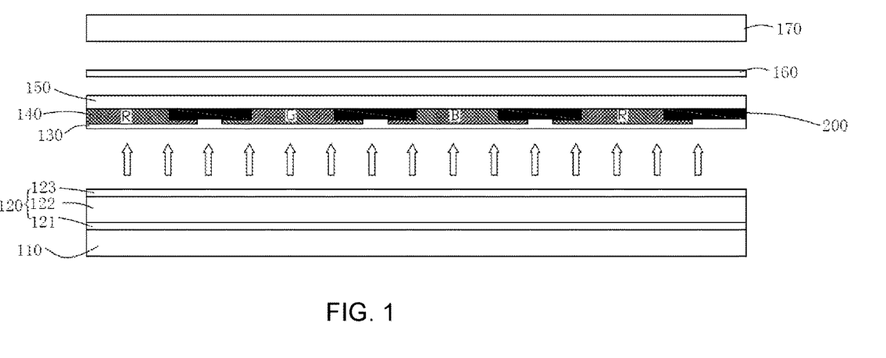
FIG. 1 is a section view of the touch display panel according to a first embodiment of the invention.

In addition, in the present embodiment, the organic light emitting unit 120 includes an anode 121, a cathode 123, and a light emitting layer 122 located between the anode 121 and the cathode 123. The anode 121 or the cathode 123 electrically connects the output terminal of the thin film transistor. A polarizer 160 is provided above the upper substrate 150, and a cover lens 170 is provided on the polarizer 160.

Figure 2:
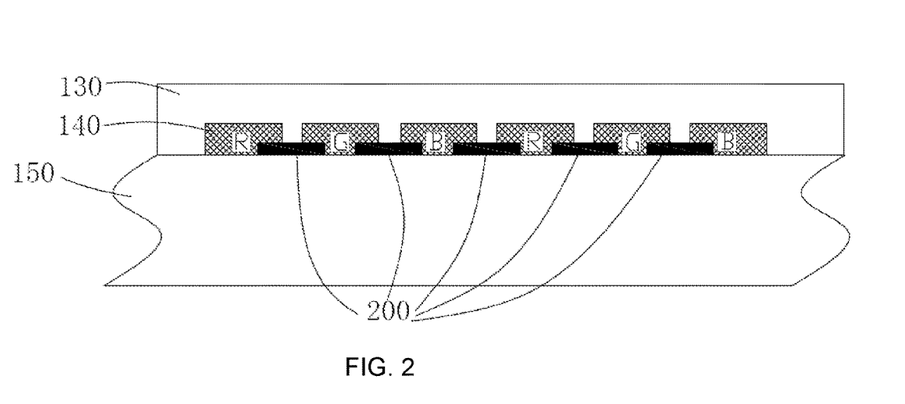
FIG. 2 is a section view of the upper substrate, the black matrix, the photoresist layer, coating protective layer according to the first embodiment of the invention.
Figure 6:
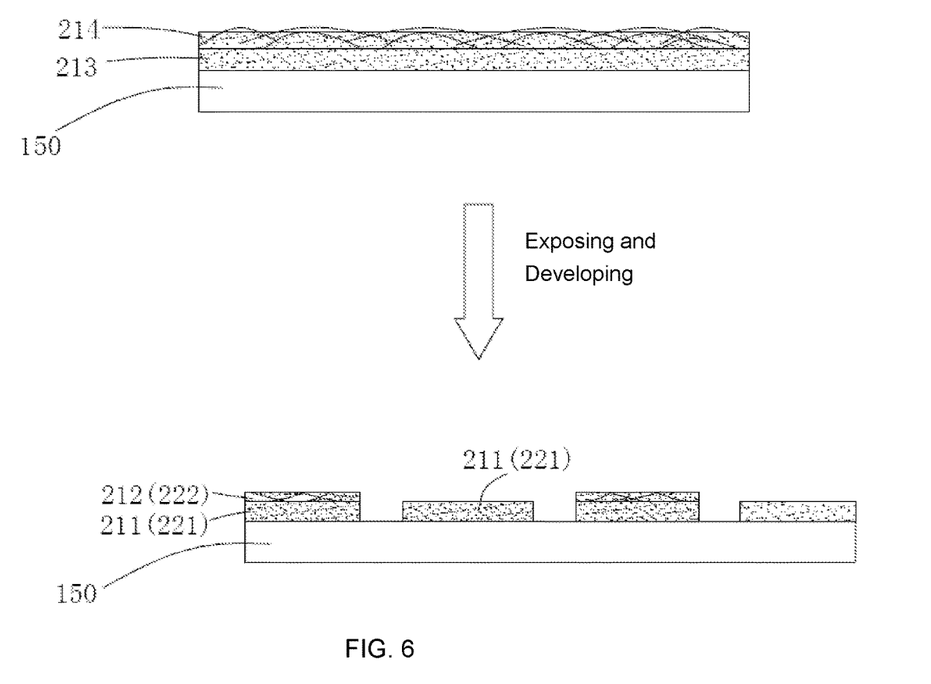
FIG. 6 is flow chart of a method for manufacturing the black matrix according to the first embodiment of the invention.

In the following, a method of manufacturing the above touch display panel will be described. Referring to FIGS. 1, 2 and 6. The method includes the following steps: providing a lower substrate 110, providing a upper substrate 150. The upper substrate 150 and the lower substrate 110 may be provided separately. An uncured black light-shielding layer 213 is applying to the upper substrate 150.

A touch electrode layer 214 is applied onto the upper substrate 150. In the present embodiment, the sequence for applying the black light-shielding layer 213 and the touch electrode layer 214 is indefinitive. The black light-shielding layer 213 may be applied to the upper substrate 150 after application of the touch electrode layer 214 onto the upper substrate 150, and vice versa. In the present embodiment, the touch electrode layer 214 is a mixed layer of black photosensitive resin and nano conductive wire.

The black matrix 200 is formed by exposing and developing the black light-shielding layer 213 and the touch electrode layer 214. The black matrix 200 includes a plurality of transverse light-shielding strips 210 extending along a first direction and a plurality of longitudinal light-shielding strips 220 extending along a second direction. The first direction and the second direction are perpendicular to each other. The plurality of the transverse light-shielding strips 210 and a plurality of the longitudinal light-shielding strips 220 are interwoven to form a plurality of opening regions. The opening regions are permeable to light. The transverse light-shielding strips 210 and the longitudinal light-shielding strips 220 includes a first black substrate layer 211 and a first touch electrode layer 212. And the first black substrate layer 211 can be stacked with the first touch electrode layer 212. In this embodiment, an amount of exposure and development can be once, twice or more times.

The following would be described under twice exposure and development. First, the first exposure is performed using a mask with a predetermined pattern. The first exposure is a contact exposure. The exposure energy can be from 10 mj to 50 mj, such as 10 mj, 15 mj, 20 mj, 15 mj, 30 mj, 35 mj, 40 mj, 45 mj, 50 mj, etc. The purpose of the first exposure is mainly for forming the black matrix layer. And then it is the development. The process of development can completely reserve the region which is exposed, and completely remove the region which is not exposed. Then the second exposure is performed with the mask with a predetermined pattern. The second exposure is not a contact exposure. The exposure energy can be from 50 mj to 100 mj, such as 50 mj, 60 mj, 70 mj, 80 mj, 90 mj, 100 mj, etc., between 50 mj and 100 mj, etc. The purpose of this exposure is to remove part of the touch electrode layer 214 on the surface during subsequent processing. Then, develop to remove the part of the touch electrode layer 214, leaving the black substrate layer below the touch electrode layer 214 to form the black matrix 200.

The photoresist layer 140 is formed in the opening region, for example, the photoresist layers 140 is red photoresist layers (R), green photoresist layer (G), or blue photoresist layer (B). The arrangement order of the red photoresist layer (R), the green photoresist layer (G) and the blue photoresist layer (B) is a well-known general knowledge of those skilled in the art and will not be described here. For another example, the photoresist layers 140 is red photoresist layers (R), green photoresist layer (G), blue photoresist layer (B) or white photoresist layer (W). The arrangement order of the red photoresist layer (R), the green photoresist layer (G), the blue photoresist layer (B) and the white photoresist layer (W) is a well-known general knowledge of those skilled in the art and will not be described here.

In this embodiment, the transverse light-shielding strip 210 or the longitudinal light-shielding strip 220 include a second black matrix layer 221 and a second touch electrode layer 222. In other words, the second touch electrode layer 222 is included in a black matrix 200. The second black substrate layer 221 is stacked with the second touch electrode layer 222. That is, the second black matrix layer 221 is stacked on the second touch electrode layer 222, or the second touch electrode layer 222 is stacked on the second black substrate layer 221. In this embodiment, the second black matrix layer 221 is used for shading, and the second touch electrode layer 222 is used as one of the electrodes of the touch unit. The extending direction of the second touch electrode layer 222 is perpendicular to the extending direction of the first touch electrode layer 212. In the present embodiment, when the first touch electrode layer 212 is included in transverse light-shielding strip 210, the first touch electrode layer 212 extends along the X-axis direction. And when the second touch electrode layer 222 is contained in the longitudinal light-shielding strip 220, the second touch electrode layer 222 extends along the Y-axis direction. Thus, both the first touch electrode and the second touch electrode are contained in the black matrix 200.

In the present embodiment, a step of forming a conductive bridge 180 on the upper substrate 150 can also be included. The conductive bridge 180 for connecting the second touch electrode on both sides of the first touch electrode, the conductive bridge 180 is electrically insulated from the first touch electrode.

The Second Embodiment

Figure 7:
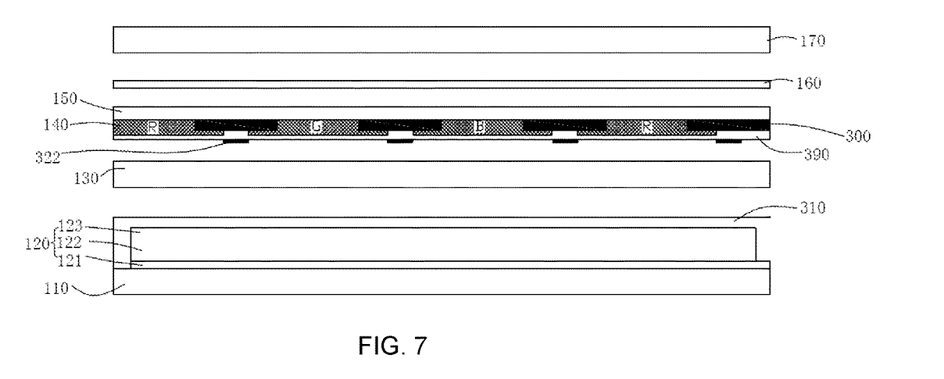
FIG. 7 is a section view of the touch display panel according to a second embodiment of the invention.

FIG. 7 is a touch display panel provided in the second embodiment of the present invention. The structure of FIG.

7 is similar to that of FIG. 1. And therefore the same element symbol represents the same element. The main difference between the present embodiment and the first embodiment is the second touch electrode layers.

Refer to FIG. 7, in the present embodiment, the second touch electrode layer 322 is not included in the black matrix 300. Specifically, the film packaging layer 310 is configured on the organic light emitting unit 120. An over coating layer 130 is configured on the film package layer 310. The second touch electrode layer 322 is configured on the over coating layer 130. The extending direction of the second touch electrode layer 322 and the extending direction of the first touch electrode layer 212 are perpendicular to each other. An insulating layer is configured between the second touch electrode layer 322 and the black matrix 300. The insulating layer is an intermediate insulating layer 390. That is, the second touch electrode layer 322 is located below the black matrix 300 layer. The touch display panel of this embodiment can also realize the touch function, and facilitate the thinning of the touch screen while reducing the cost.

In the present embodiment, the second touch electrode layer 322 is made of indium tin oxide (ITO). In another embodiment of the present invention, the second touch electrode layer is made of a metal mesh. The metal mesh is made of a metal material such as silver (Ag), titanium (Ti), Molybdenum (Mo), aluminum (Al) and other metal materials.

The Third Embodiment

Figure 8:
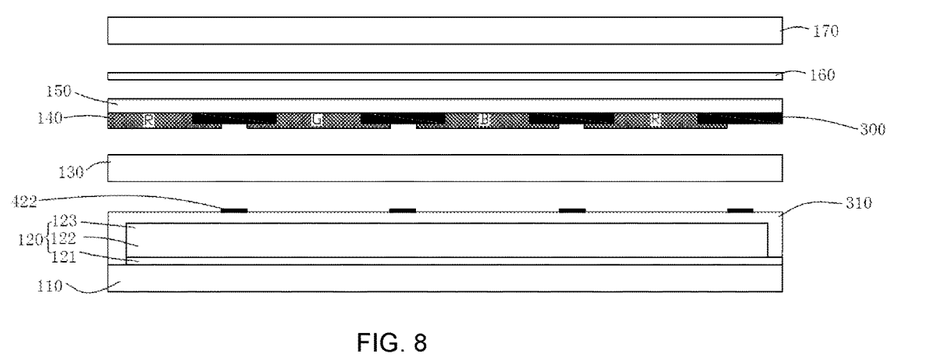
FIG. 8 is a section view of the touch display panel according to a third embodiment of the invention.

FIG. 8 is a touch display panel provided in the third embodiment of the present invention. The structure of FIG. 8 is similar to that of FIG. 1. And therefore the same element symbol represents the same element. The main difference between the present embodiment and the first embodiment is the second touch electrode layers.

Refer to FIG. 8, in the present embodiment, the second touch electrode layer 422 is not included in the black matrix 300. Specifically, the film packaging layer 310 is configured on the organic light emitting unit 120. A second touch electrode layer 422 is configured on the film packaging layer 310. The extending direction of the second touch electrode layer 422 and the extending direction of the first touch electrode layer 212 is perpendicular to each other. And an insulating layer is configured between the second touch electrode layer 422 and the black matrix 300. And the insulating layer is an over coating layer 130. That is, the second touch electrode layer 422 is located below the black matrix 300 layer. The touch display panel of this embodiment can also realize the touch function, and facilitate the thinning of the touch screen while reducing the cost.

In the present embodiment, the second touch electrode layer 422 is made of indium tin oxide (ITO). In another embodiment of the present invention, the second touch electrode layer is made of a metal mesh. The metal mesh is made of a metal material such as silver (Ag), titanium (Ti), Molybdenum (Mo), aluminum (Al) and other metal materials.

The Fourth Embodiment

Figure 9:
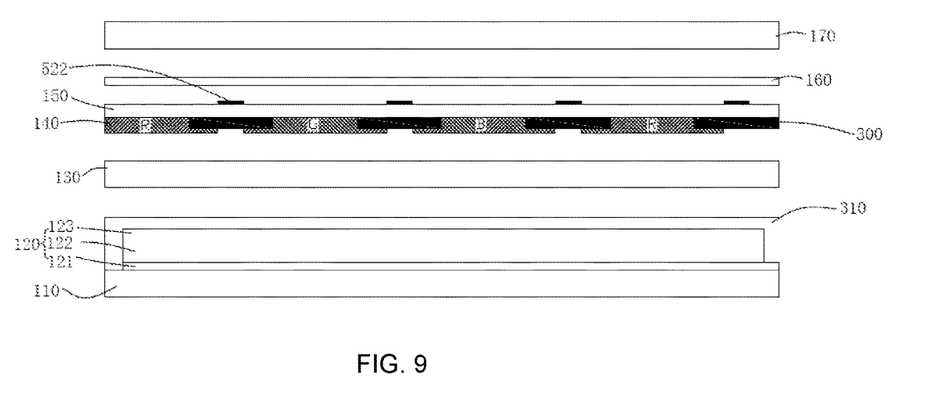
FIG. 9 is a section view of the touch display panel according to a fourth embodiment of the invention.

FIG. 9 is a touch display panel provided in the fourth embodiment of the present invention. The structure of FIG. 9 is similar to that of FIG. 1. And therefore the same element symbol represents the same element. The main difference between the present embodiment and the first embodiment is the second touch electrode layers.

Refer to FIG. 9, in the present embodiment, the second touch electrode layer 522 is not included in the black matrix 300. Specifically, the upper substrate 150 is configured with a second touch electrode layer 522 on the surface which is back to the black matrix 300. The extending direction of the second touch electrode layer 522 is perpendicular to the extending direction of the first touch electrode layer 212. The touch display panel of this embodiment can also realize the touch function, and facilitate the thinning of the touch screen while reducing the cost.

In the present embodiment, the second touch electrode layer 422 is made of indium tin oxide (ITO). In another embodiment of the present invention, the second touch electrode layer is made of a metal mesh. The metal mesh is made of a metal material such as silver (Ag), titanium (Ti), Molybdenum (Mo), aluminum (Al) and other metal materials.

It should be noted that the various embodiments in the present specification are described in a progressive manner, each of which focuses on the differences from the other embodiments, and the same similar parts between the various embodiments refer to each other can. For the device embodiment, since it is substantially similar to the method embodiment, the description is relatively simple and the relevant part is described in part of the method embodiment.

The present invention has the advantages by the description of the above embodiments as follows.

The transverse light-shielding strips or the longitudinal light-shielding strips includes a first black substrate layer and a first touch electrode layer, and the first black substrate layer is stacked with the first touch electrode layer. So the first black substrate layer or the first touch electrode layer is included in the black matrix. It is not necessary to provide two additional touch electrodes as in the prior art, then the thickness of the touch screen can be reduced, and the touch can be lightened. And the process and the costs also can be reduced. Since the first black substrate layer and the first touch electrode layer are stacked to form one of the light-shielding strips, the whole light shielding strips is formed by the touch electrode. The costs is greatly reduced.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A touch display panel comprising:
  a lower substrate;
  an upper substrate, the upper substrate and the lower substrate disposed opposite to each other, the upper substrate having a black matrix and a photoresist layer thereon, the black matrix comprising a plurality of transverse light-shielding strips extending along a first direction and a plurality of longitudinal light-shielding strips extending along a second direction, the first direction and the second direction being perpendicular to each other, the plurality of the transverse light-shielding strips and the plurality of the longitudinal light-shielding strips interwoven to form a plurality of opening regions, the photoresist layers located in the opening regions;
  wherein one of the transverse light-shielding strip and the longitudinal light-shielding strip comprises a first black substrate layer and a first touch electrode layer, the first black substrate layer being stacked with the first touch electrode layer, the first black substrate is physically different from the first touch electrode layer.

2. The touch display panel as claimed in claim 1, wherein another of the transverse light-shielding strip or the longitudinal light-shielding strip comprises a second black substrate layer and a second touch electrode layer, the second black substrate layer is stacked with the second touch electrode layer, and the second touch electrode layer and the first touch electrode are electrically insulated with each other.

3. The touch display panel as claimed in claim 2, wherein a conductive bridge locates on the upper substrate, the conductive bridge is used for electrically connecting the second touch electrode layer on both sides of the first touch electrode layer, and the conductive bridge is electrically insulated from the first touch electrode layer.

4. The touch display panel as claimed in claim 1, wherein the second touch electrode layer locates on the bottom of the black matrix, an extending direction of the second touch electrode layers is perpendicular to that of the first touch electrode layers, and an insulating layer is configured between the second touch electrode layers and the first touch electrode layers.

5. The touch display panel as claimed in claim 1, wherein the upper substrate is provided with a second touch electrode layer on a surface back to the black matrix, and an extending direction of the second touch electrode layers is perpendicular to that of the first touch electrode layers.

6. The touch display panel as claimed in claim 1, wherein the first black substrate layer is located on a bottom surface of the upper substrate, the first touch electrode layer is stacked on a surface of the first black matrix layer; or the first touch electrode layer is located on a bottom surface of the upper substrate, the first black matrix layer is stacked on the surface of the first touch electrode layer.

7. The touch display panel as claimed in claim 1, wherein a thickness of the first touch electrode layer is 10 nm~1000 nm, and a thickness of the first black matrix layer is 0.5 um~50 um.

8. The touch display panel as claimed in claim 1, wherein the first touch electrode layer is a mixed layer formed by black photosensitive resin and nano conductive wires.

9. The touch display panel as claimed in claim 8, wherein the nano conductive wire is made of gold, silver, copper, aluminum, carbon or alloy, a diameter of the nano conductive wires is 10 nm~1000 nm, a length is 0.1 um~50 um.

10. A method of manufacturing a touch display panel comprising:
providing a lower substrate;
providing a upper substrate;
applying a black light-shielding layer to the upper substrate;
applying a touch electrode layer onto the upper substrate;
exposing, developing the black light-shielding layer and the touch electrode layer to form the black matrix, the black matrix comprising a plurality of transverse light-shielding strips extending along a first direction and a plurality of longitudinal light-shielding strips extending along a second direction, the first direction and the second direction being perpendicular to each other, the plurality of the transverse light-shielding strips and the plurality of the longitudinal light-shielding strips interwoven to form a plurality of opening regions, one of the transverse light-shielding strips and the longitudinal light-shielding strips comprising a first black substrate layer and a first touch electrode layer, and the first black substrate layer being stacked with the first touch electrode layer, the first black substrate is physically different from the first touch electrode layer;
forming photoresist layers in the opening regions.

* * * * *